(12) United States Patent
Ciou

(10) Patent No.: US 11,300,636 B2
(45) Date of Patent: Apr. 12, 2022

(54) TESTING DEVICE FOR DETERMINING ELECTRICAL CONNECTION STATUS

(71) Applicant: Powertech Technology Inc., Hsinchu (TW)

(72) Inventor: Jian-Yu Ciou, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 59 days.

(21) Appl. No.: 17/080,908

(22) Filed: Oct. 27, 2020

(65) Prior Publication Data

US 2021/0373089 A1 Dec. 2, 2021

(30) Foreign Application Priority Data

May 28, 2020 (TW) .................................. 109117890

(51) Int. Cl.
*G01R 31/30* (2006.01)
*G01R 31/68* (2020.01)

(52) U.S. Cl.
CPC ......... *G01R 31/68* (2020.01); *G01R 31/3004* (2013.01)

(58) Field of Classification Search
CPC .............. G01R 1/0408; G01R 31/2808; G01R 31/2818; G01R 31/66
See application file for complete search history.

(56) References Cited

U.S. PATENT DOCUMENTS

| 2013/0249696 A1* | 9/2013 | Ikuta | H02H 3/085 |
| | | | 361/87 |
| 2015/0346265 A1* | 12/2015 | Koh | G01R 19/165 |
| | | | 324/538 |
| 2016/0299175 A1* | 10/2016 | Dewey | G01R 1/0416 |

\* cited by examiner

*Primary Examiner* — Tung X Nguyen
(74) *Attorney, Agent, or Firm* — Burris Law, PLLC

(57) ABSTRACT

A testing device includes a measuring unit, a testing board supporting the measuring unit and connected to the measuring unit, and a connecting interface coupled to the testing board. The connecting interface includes connecting terminals protruding in a direction away from the testing board, and is connected to a device under test (DUT) via the connecting terminals. When the DUT is connected to the connecting interface, the measuring unit supplies a constant electric current via the testing board and the connecting interface to the DUT for a preset duration to result in a voltage, measures the voltage, and determines, based on a result of measurement of the voltage, an electrical connection status of the DUT.

10 Claims, 4 Drawing Sheets

TESTING DEVICE FOR DETERMINING ELECTRICAL CONNECTION STATUS

CROSS-REFERENCE TO RELATED APPLICATION

This application claims priority of Taiwanese Invention Patent Application No. 109117890, filed on May 28, 2020.

FIELD

The disclosure relates to a testing device, and more particularly to a testing device for determining an electrical connection status of a device under test.

BACKGROUND

Conventionally, one of the functions usually provided by a multifunction testing device includes determination of electrical connection status of connectors and traces on a device under test (DUT). However, the multifunction testing device is often bulky and costly, and consumes a large amount of electricity. Sometimes, the multifunction testing device has to be set up in a clean room. Moreover, a procedure of setting the DUT on the multifunction testing device is often complicated and time-consuming, resulting in inconvenience of use.

SUMMARY

Therefore, an object of the disclosure is to provide a testing device for determining an electrical connection status of a device under test that can alleviate at least one of the drawbacks of the prior art.

According to the disclosure, the testing device includes a measuring unit, a testing board that supports the measuring unit and that is electrically connected to the measuring unit, and a connecting interface that is electrically coupled to the testing board.

The connecting interface includes a plurality of connecting terminals that protrude in a direction away from the testing board, and that are configured to be electrically connected to the DUT via the connecting terminals.

The measuring unit is configured to, when the DUT is electrically connected to the connecting interface, supply a constant electric current via the testing board and the connecting interface to the DUT for a preset duration to result in a voltage, to measure the voltage, and to determine, based on a result of measurement of the voltage, the electrical connection status of the DUT.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
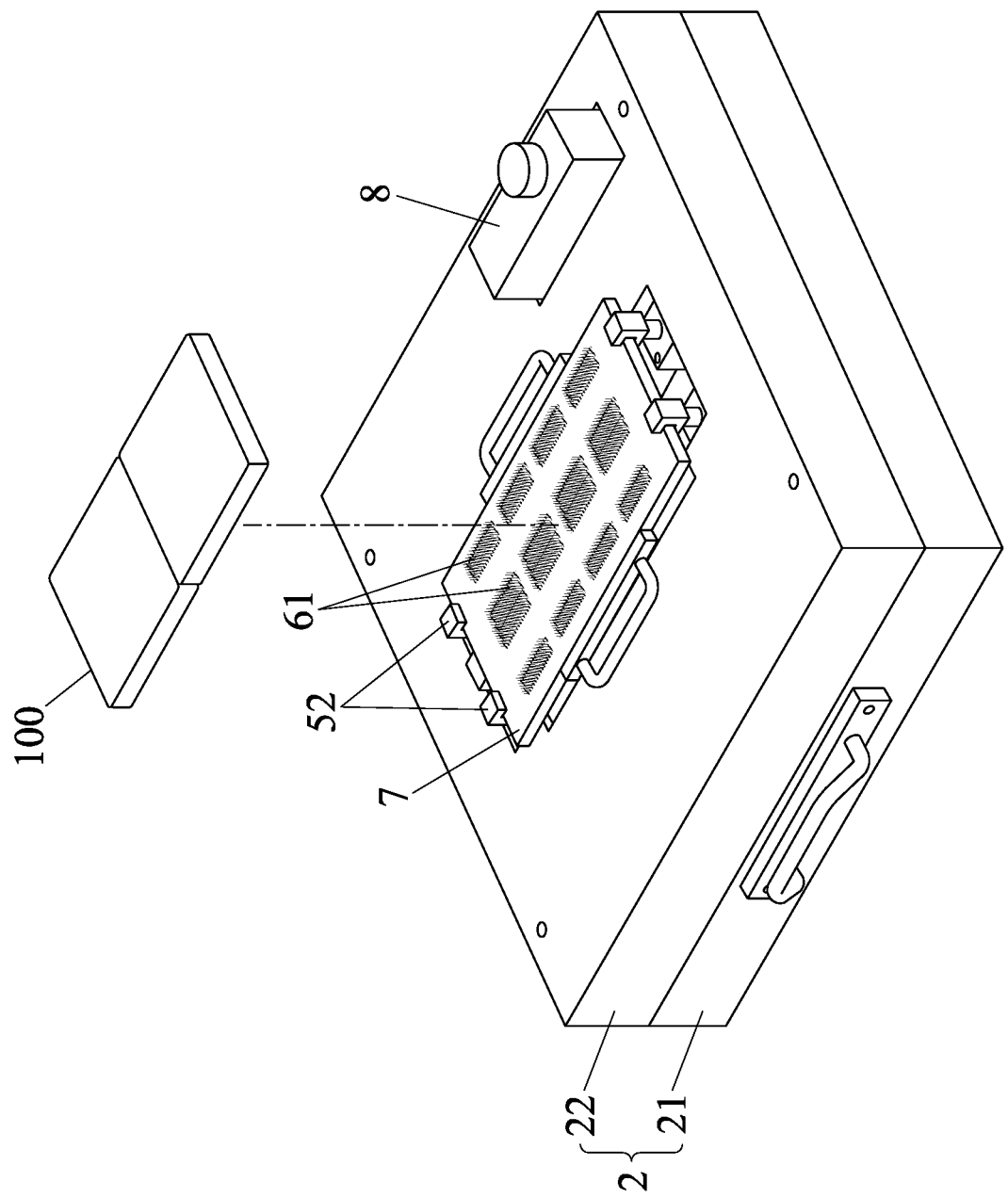
FIG. 1 is a perspective view of an embodiment of a testing device for determining an electrical connection status of a device under test according to the disclosure.

Referring to FIGS. 1 to 4, an embodiment of a testing device for determining an electrical connection status of a device under test (DUT) 100 is illustrated. The DUT 100 may be a printed circuit board of an electronic device. The DUT 100 includes a plurality of traces (not shown) and a plurality of connectors (not shown).

In practice, the connectors are usually mounted on the DUT 100 by manual insertion such that the connectors and the traces are electrically connected. However, human error during manual insertion is inevitable, which usually brings about failure of electrical connection between the connector and the trace, and hence checking the electrical connection status of the DUT 100 after manual insertion is necessary. In one embodiment, the electrical connection status refers to whether electrical connections each between one of the connectors and a corresponding one of the traces are established successfully.

The testing device includes a housing 2, a testing board 3, a measuring unit 4, a gripping assembly 5, a connecting interface 6, a carrier 7, a drive component 8, and a plurality of coaxial lines 9 which interconnect the connecting interface 6 and the testing board 3.

The housing 2 includes a base 21 and a cover 22. The cover 22 has an opening 20. The base 21 and the cover 22 cooperatively define a receiving space 200 which is in spatial communication with the opening 20 and which accommodates the testing board 3, the measuring unit 4, the gripping assembly 5, the connecting interface 6, the drive component 8 and the coaxial lines 9.

The testing board 3 is disposed on the base 21, and supports the measuring unit 4. In this embodiment, the testing board 3 is a printed circuit board.

The measuring unit 4 is mounted on the testing board 3, and is electrically connected to the testing board 3. The measuring unit 4 includes a current source that supplies a constant electric current, and a converter that is electrically connected to the current source. The converter is configured to measure a voltage caused by the constant electric current thus supplied. In this embodiment, the measuring unit 4 is a microcontroller (MCU), the current source is a charge time measurement unit (CTMU), and the converter is an analog-to-digital converter (ADC). However, implementation of the measuring unit 4 is not limited to the disclosure herein and may vary in other embodiments.

Figure 2:
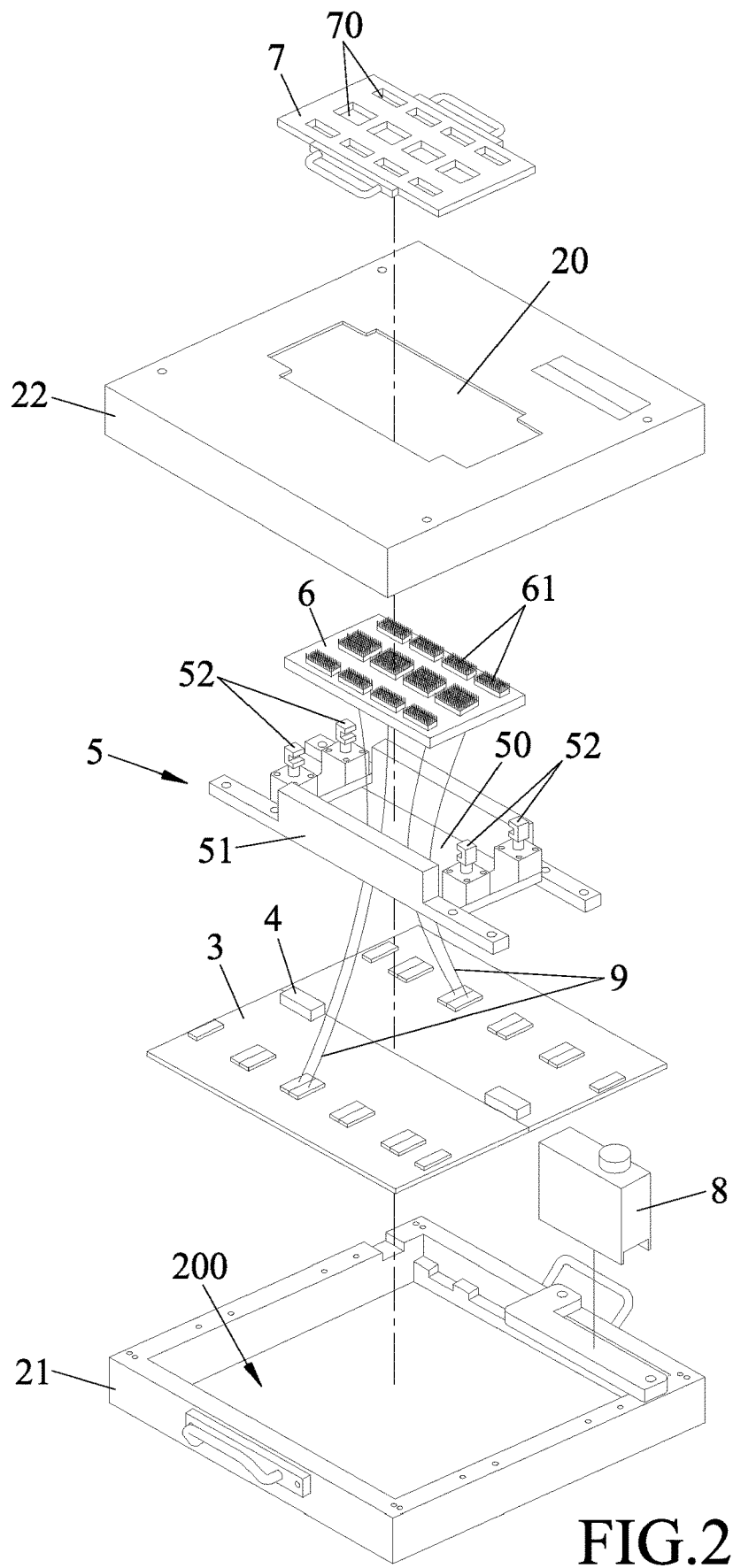
FIG. 2 is an exploded perspective view of the embodiment of the testing device according to the disclosure.
Figure 3:
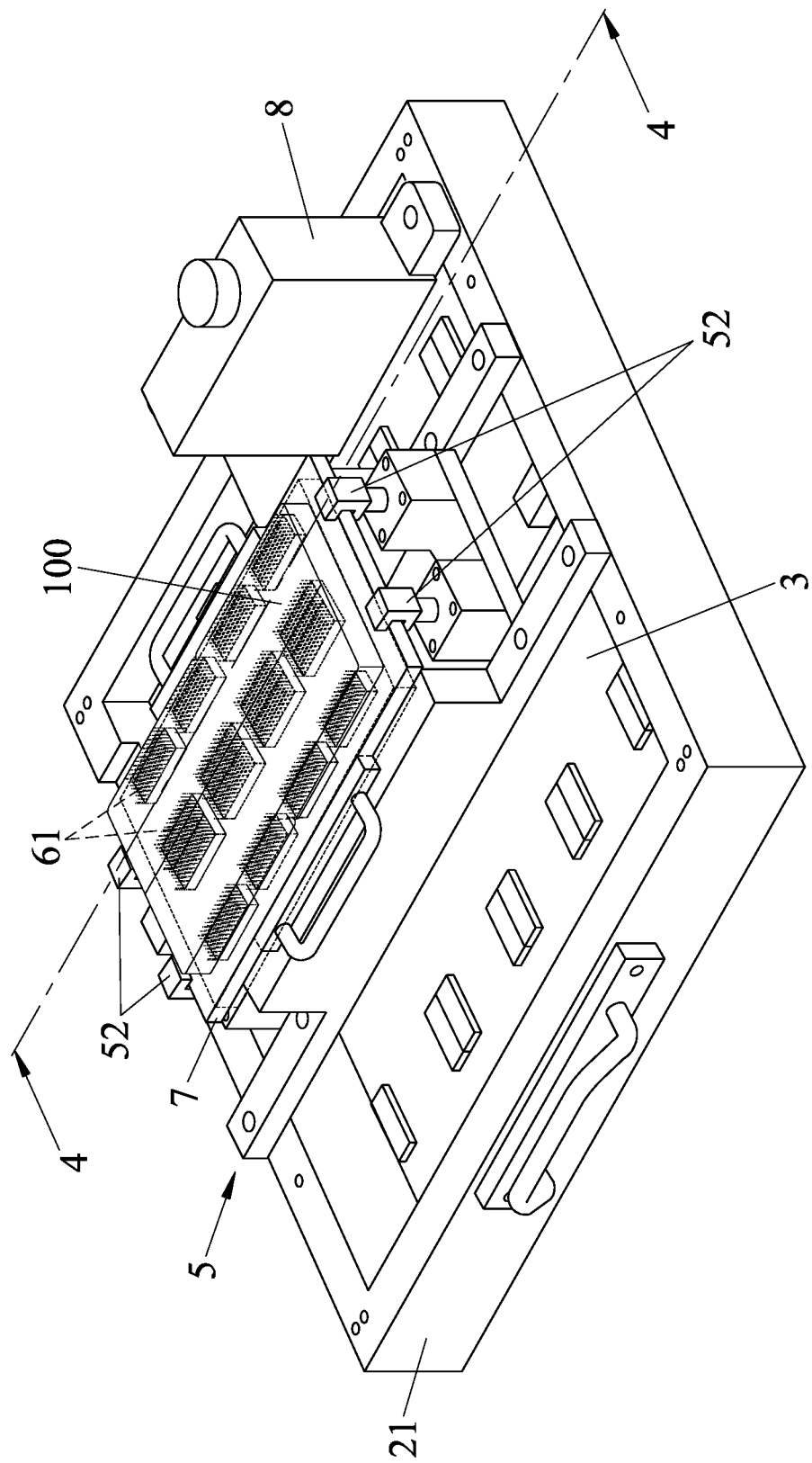
FIG. 3 is a perspective view of the embodiment of the testing device according to the disclosure without showing a cover.
Figure 4:
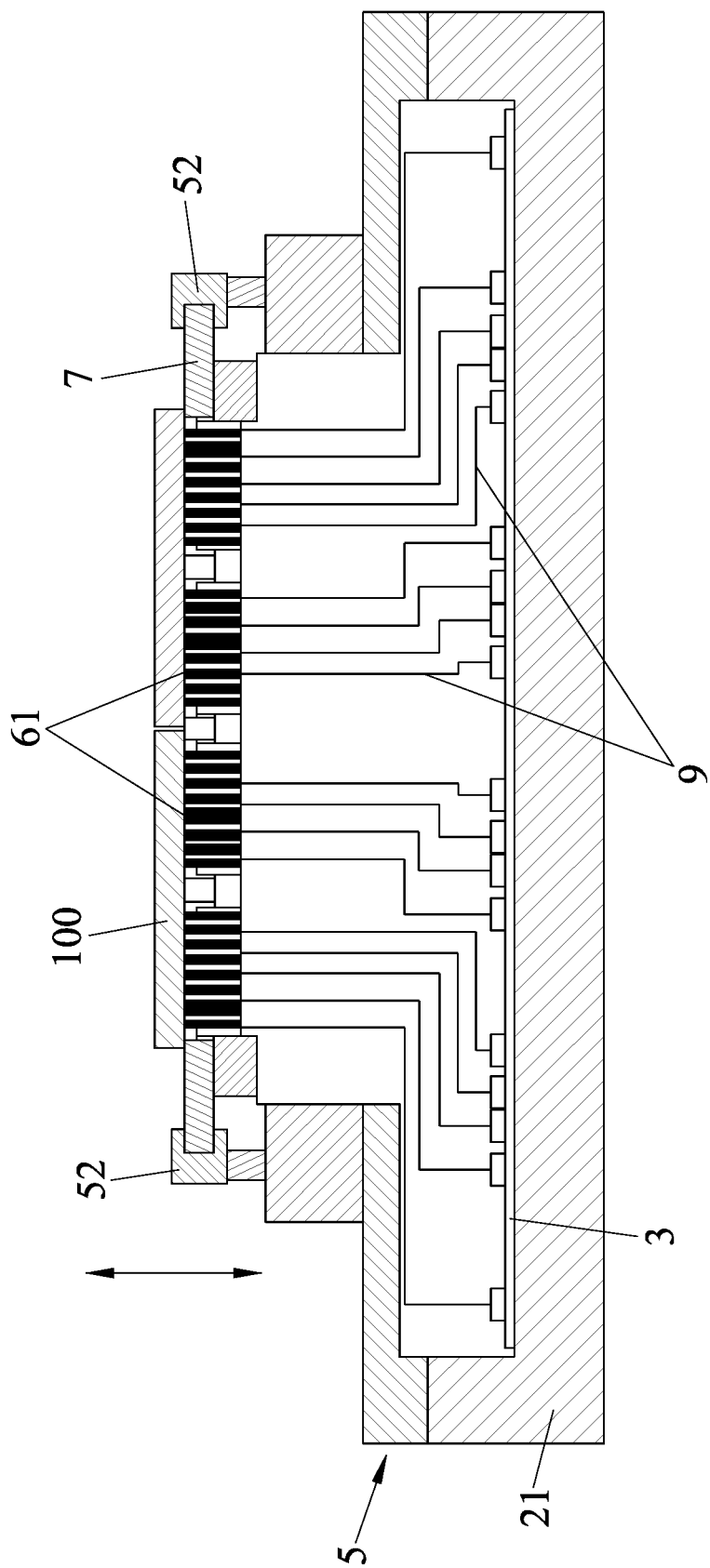
FIG. 4 illustrates a sectional view of the embodiment of the testing device taken along an imaginary line A-A of FIG. 3.

The gripping assembly 5 is mounted on the base 21 and above the testing board 3. The carrier 7 is removably attached to the gripping assembly 5, and is positioned outside the housing 2 over the opening 20 of the cover 22. The gripping assembly 5 includes a surrounding wall 51 and a plurality of grippers 52. The surrounding wall 51 defines a surrounded space 50. The grippers 52 are disposed on an edge of the surrounding wall 51 opposite to the testing board 3, and are spaced apart from each other. In this embodiment, the grippers 52 are four in number, but the number of the grippers 52 is not limited to the disclosure herein and may vary in other embodiments. As shown in FIG. 2, two pairs of the grippers 52 are respectively located at opposite sides of the surrounding wall 51. The grippers 52 protrude through the opening 20, and are configured to grip the carrier 7 for removable attachment of the carrier 7 to the gripping assembly 5.

The connecting interface 6 is positioned in the surrounded space 50, and between the gripping assembly 5 and the carrier 7. The connecting interface 6 includes a plurality of connecting terminals 61 that protrude in a direction away from the testing board 3. The carrier 7 is formed with a plurality of through holes 70 that respectively correspond to the connecting terminals 61. The carrier 7 is configured to accommodate the DUT 100. As shown in FIG. 1, the connecting terminals 61 protrude through the opening 20 and respectively through the through holes 70 of the carrier 7. The connecting interface 6 is configured to be electrically connected to the DUT 100 via the connecting terminals 61, and is electrically coupled to the testing board 3 via the connecting terminals 61 and the coaxial lines 9. In this way, signal transmission can be conducted between the testing board 3 and the DUT 100 via the connecting interface 6 and the coaxial lines 9.

In this embodiment, the drive component 8 is implemented by an assembly of a cylinder and an air valve. The drive component 8 is mounted on the base 21, and is coupled to the gripping assembly 5. Specifically, one end of the drive component 8 is connected to an air compressor (not shown), and another end of the drive component 8 is connected via four tubes to the grippers 52, respectively (not shown). The air compressor keeps providing compressed air to the drive component 8, and the drive component 8 is configured to drive, by utilizing the potential energy of the compressed air, the grippers 52 to move relative to the testing board 3. In this way, the carrier 7 which is gripped by the grippers 52 is brought to move toward or away from the connecting interface 6, such that the DUT 100 held by the carrier 7 is changed between a connection state and a disconnection state. In the connection state, the DUT 100 is electrically connected to the connecting terminals 61. In the disconnection state, the DUT 100 is disconnected from the connecting terminals 61. It is noted that the drive component 8 includes a control button that is to be operated to control movement of the grippers 52 relative to the testing board 3. As shown in FIG. 1, the drive component 8 protrudes through the cover 22, and the control button is exposed outside of the housing 2 for convenience of manual operation.

In a scenario where the electrical connection status of the DUT 100 is to be determined by the testing device according to the disclosure, the DUT 100 is first placed on the carrier 7 for being held thereby. Next, the grippers 52 grip the carrier 7, and are driven by the drive component 8 to move so as to bring the carrier 7 to move toward the connecting interface 6. Eventually, the DUT 100 changes into the connection state, in which the DUT 100 is electrically connected to the connecting terminals 61 of the connecting interface 6.

The current source (e.g., CTMU) of the measuring unit 4 is configured to, when the DUT 100 is electrically connected to the connecting terminals 61, supply the constant electric current via the testing board 3, the coaxial lines 9 and the connecting interface 6 to the DUT 100 for a preset duration so as to result in a voltage. Then, the converter (e.g., the ADC) of the measuring unit 4 is configured to measure the voltage. The measuring unit 4 is configured to determine, based on a result of measurement of the voltage, the electrical connection status of the DUT 100.

Specifically, the measuring unit 4 is configured to obtain a detected voltage value through the measurement of the voltage, and determine the electrical connection status of the DUT 100 based on a voltage difference between the detected voltage value and a reference voltage value. The reference voltage value is obtained through measurement of the voltage when one of the traces and a corresponding one of the connectors under test (referred to as the trace and the connector under test) are not connected. The measuring unit 4 is configured to determine that the trace and the connector under test are in electrical connection with each other when the voltage difference between the detected voltage value and the reference voltage value is greater than a predetermined value (e.g., 0.3 volts). The predetermined value can be designated based on practical needs, and is not limited to the disclosure herein.

Principles of determining the electrical connection status by means of voltage measurement will be further described below.

A process of checking the electrical connection status of the DUT 100 may be analogous to charging a capacitor having capacitance (C) and measuring the voltage (V) across the capacitor thus charged. When charged with the constant electric current by the measuring unit 4, the charge held by the capacitor can be formulated as:

$$I \times t = C \times V$$

where I represents the constant electric current supplied to the DUT 100, t represents the preset duration for which the constant electric current has been provided, C represents the capacitance of the capacitor, and V represents the voltage measured across the capacitor. It is worth to note that, in one embodiment, the capacitance (C) may be equivalent capacitance of a combination of the converter of the measuring unit 4, the testing board 3, the connecting interface 6, and the trace of the DUT 100 if the connector and the trace under test are electrically connected, and may vary depending on the electrical connection status of the DUT 100. That is to say, assuming that the capacitance (C) has a first capacitance value ($C_1$) when the connector and the trace under test of the DUT 100 are not in electrical connection with each other, the capacitance (C) will have a second capacitance value ($C_2$) different from the first capacitance value ($C_1$) when the connector and the trace under test are in electrical connection with each other. Moreover, the charge held by the capacitor is kept constant for each test because both the constant electric current and the preset duration have fixed values. Therefore, the voltage (V) measured across the capacitor will have different values when the capacitance (C) has different values for different electrical connection status of the DUT 100. In other words, assuming that the voltage (V) has a first voltage value ($V_1$) when the connector(s) and the trace(s) of the DUT 100 are not in electrical connection with each other, the voltage (V) will have a second voltage value ($V_2$) different from the first voltage value ($V_1$) when the capacitance (C) has the second capacitance value ($C_2$) because the connector and the trace under test are electrically connected to each other and equivalent capacitance of the trace is taken into consideration. Normally, when the connector and the trace under test are electrically connected, the equivalent capacitance of the trace contributes to a higher value of the capacitance (C), and hence the voltage (V) thus measured will be lower.

The testing device of the disclosure allows determination of the electrical connection status by means of voltage measurement to be made efficiently, and the determination can be performed individually for all pairs of the connectors and the traces on the DUT 100. Moreover, the testing device according to the disclosure occupies smaller space and is more energy-efficient compared with conventional multi-function testing devices.

In one embodiment, after the DUT 100 has been electrically connected to the connecting terminals 61 and after the testing device has measured the voltage resulting from supply of the constant electric current to the DUT 100, the testing device according to the disclosure can be further connected to a portable device (e.g., a tablet computer) for transmitting the result of measurement of the voltage to the portable device. The portable device is installed with customized software that is capable of performing analysis on the result of measurement of the voltage and determining the electrical connection status of the DUT 100 based on the result of measurement of the voltage. More specifically, after configuring settings of the customized software which are specific to the DUT 100 and obtaining the detected voltage value relevant to an electrical connection status of a connector and a trace on the DUT 100, the customized software indicates that a closed circuit is detected (i.e., the connector and the trace are in electrical connection with each other) by displaying a green light via a user interface when it is determined that the voltage difference between the detected voltage value and the reference voltage value is greater than the predetermined value. On the other hand, the customized software indicates that an open circuit is detected (i.e., the connector and the trace are not in electrical connection with each other) by displaying a red light via the user interface when it is determined that the voltage difference between the detected voltage value and the reference voltage value is smaller than the predetermined value. In this way, locating one of the connectors and a corresponding one of the traces on the DUT 100 where poor contact occurs can be realized.

To sum up, the testing device according to the disclosure utilizes the measuring unit 4 to supply, when the DUT 100 is connected to the connecting interface 6 of the testing device, the constant electric current via the testing board 3 and the connecting interface 6 to the DUT 100 for the preset duration to result in the voltage, to measure the voltage, and to determine, based on the result of measurement of the voltage, the electrical connection status of the DUT 100. Compared with conventional multifunction testing devices, the testing device according to the disclosure has a single dedicated function, and hence occupies a smaller space and consumes less electricity. Moreover, through the gripers 52 and the drive component 8, setting the DUT 100 on the testing device according to the disclosure can be made simple and time-saving, and checking the electrical connection status of the DUT 100 by using the testing device according to the disclosure can be performed efficiently.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A testing device for determining an electrical connection status of a device under test (DUT), said testing device comprising:
    a measuring unit;
    a testing board supporting said measuring unit and electrically connected to said measuring unit; and
    a connecting interface electrically coupled to said testing board, including a plurality of connecting terminals that protrude in a direction away from said testing board, and configured to be electrically connected to the DUT via said connecting terminals,
    wherein said measuring unit is configured to, when the DUT is electrically connected to said connecting interface, supply a constant electric current via said testing board and said connecting interface to the DUT for a preset duration to result in a voltage, to measure the voltage, and to determine, based on a result of measurement of the voltage, the electrical connection status of the DUT.

2. The testing device as claimed in claim 1, the DUT including a trace and a connector, wherein said measuring unit is configured to:
    obtain a detected voltage value through measurement of the voltage; and
    determine the electrical connection status of the DUT based on a voltage difference between the detected voltage value and a reference voltage value, which is obtained through measurement of the voltage when the trace and the connector are not connected.

3. The testing device as claimed in claim 2, wherein said measuring unit is configured to determine that the trace and the connector are in electrical connection with each other when the voltage difference between the detected voltage value and the reference voltage value is greater than a predetermined value.

4. The testing device as claimed in claim 1, further comprising:
    a gripping assembly mounted above said testing board; and
    a carrier removably attached to said gripping assembly, said connecting interface being positioned between said gripping assembly and said carrier,
    wherein when the DUT is removably held by said carrier, the DUT is electrically connected to said connecting terminals of said connecting interface.

5. The testing device as claimed in claim 4, wherein said gripping assembly includes:
    a surrounding wall defining a surrounded space where said connecting interface is positioned; and
    a plurality of grippers disposed on an edge of said surrounding wall opposite to said testing board, spaced apart from each other, and configured to grip said carrier for removable attachment of said carrier to said gripping assembly.

6. The testing device as claimed in claim 5, further comprising:
    a drive component coupled to said gripping assembly, and configured to drive said grippers to move relative to said testing board such that the DUT held by said carrier which is gripped by said grippers is changed between a connection state in which the DUT is electrically connected to said connecting terminals, and a disconnection state in which the DUT is disconnected from said connecting terminals.

7. The testing device as claimed in claim 6, further comprising:
- a housing including
  - a base on which said testing board is disposed, and
  - a cover that has an opening, said base and said cover cooperatively defining a receiving space which is in spatial communication with said opening and which accommodates said testing board, said gripping assembly, said connecting interface and said drive component,
- wherein said grippers and said connecting terminals protrude through said opening.

8. The testing device as claimed in claim 1, wherein said measuring unit includes a current source that supplies the constant electric current, and a converter that is electrically connected to said current source.

9. The testing device as claimed in claim 1, wherein:
- said measuring unit is a microcontroller (MCU);
- said current source is a charge time measurement unit (CTMU); and
- said converter is an analog-to-digital converter (ADC).

10. The testing device as claimed in claim 1, further comprising a plurality of coaxial lines which interconnect said connecting interface and said testing board.

\* \* \* \* \*